United States Patent
Gu et al.

(10) Patent No.: US 11,164,954 B2
(45) Date of Patent: Nov. 2, 2021

(54) GATE CAPPING LAYERS OF SEMICONDUCTOR DEVICES

(71) Applicant: GLOBALFOUNDRIES U.S. Inc., Santa Clara, CA (US)

(72) Inventors: Sipeng Gu, Clifton Park, NY (US); Zhiguo Sun, Halfmoon, NY (US); Guoliang Zhu, Rexford, NY (US); Xinyuan Dou, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 51 days.

(21) Appl. No.: 16/435,563

(22) Filed: Jun. 10, 2019

(65) Prior Publication Data

US 2020/0388693 A1 Dec. 10, 2020

(51) Int. Cl.
*H01L 29/51* (2006.01)
*H01L 21/02* (2006.01)
*H01L 29/78* (2006.01)
*H01L 29/66* (2006.01)

(52) U.S. Cl.
CPC ...... *H01L 29/511* (2013.01); *H01L 21/02277* (2013.01); *H01L 21/02332* (2013.01); *H01L 29/66477* (2013.01); *H01L 29/78* (2013.01)

(58) Field of Classification Search
CPC . H01L 29/511; H01L 29/66477; H01L 29/78; H01L 21/02277; H01L 21/02332
See application file for complete search history.

(56) References Cited

U.S. PATENT DOCUMENTS

| | | | | |
|---|---|---|---|---|
| 5,994,749 A | * | 11/1999 | Oda | H01L 21/76832 |
| | | | | 257/411 |
| 6,218,251 B1 | * | 4/2001 | Kadosh | H01L 29/6653 |
| | | | | 257/E21.427 |
| 9,837,504 B2 | | 12/2017 | Chen et al. | |
| 2005/0127446 A1 | * | 6/2005 | Nakanishi | H01L 29/4925 |
| | | | | 257/358 |
| 2007/0042130 A1 | | 2/2007 | Ghanayem | |
| 2009/0289284 A1 | | 11/2009 | Goh et al. | |
| 2010/0078738 A1 | * | 4/2010 | Chambers | H01L 21/02337 |
| | | | | 257/411 |
| 2015/0228586 A1 | * | 8/2015 | Usami | H01L 23/53295 |
| | | | | 257/751 |
| 2019/0371602 A1 | * | 12/2019 | Kuo | H01L 21/02126 |

OTHER PUBLICATIONS

Chia-Yu Lu et al., Impacts of SiN-Capping Layer on the Device Characteristics and Hot-Carrier Degradation of nMOSFETs, IEEE Transactions on Device and Materials Reliability, Mar. 2007, 175-180, vol. 7, No. 1, IEEE, US.

* cited by examiner

*Primary Examiner* — Davienne N Monbleau
*Assistant Examiner* — Scott Stowe
(74) *Attorney, Agent, or Firm* — David Cain

(57) ABSTRACT

A semiconductor device is provided, which includes providing an active region, a source region, a drain region, a dielectric layer, a gate structure and a nitrogen-infused dielectric layer. The source region and the drain region are formed in the active region. The dielectric layer is disposed over the source region and the drain region. The gate structure formed in the dielectric layer is positioned between the source region and the drain region. The nitrogen-infused dielectric layer is disposed over the dielectric layer and over the gate structure.

20 Claims, 3 Drawing Sheets

GATE CAPPING LAYERS OF SEMICONDUCTOR DEVICES

FIELD OF THE INVENTION

The disclosed subject matter relates generally to semiconductor devices, and more particularly to gate capping layers of semiconductor devices and methods of fabricating the same.

BACKGROUND

Technology scaling is one of the long-standing objectives in the advancement of the semiconductor industry. Modern day integrated circuit (IC) devices have a very large number of semiconductor devices, especially field effect transistor (FET) devices, fabricated on limited chip area. Reducing geometry and increasing integration of semiconductor devices result in reducing chip area and increasing operating speed of such IC devices. However, insulating layers, such as gate capping layers, are also correspondingly scaled down.

Device reliability is often sustained and improved by materials and thickness of the gate capping layer. A nitride layer, such as silicon nitride, is typically employed as a material for the gate capping layer. Due to material compatibility between the nitride layer and underlying ILD layer, which often an oxide material, a weak oxide-nitride adhesion at the interface therebetween is typically formed. The weak oxide-nitride adhesion at the interface between the gate capping layer and the underlying ILD layer often results in potential diffusion of conductive material from the gate structure to adjacent conductive structures, leading to undesirable, and often detrimental, electrical shorting between the gate structure and adjacent conductive structures.

A plasma process is typically employed on the gate capping layer to improve the adhesion at the oxide-nitride interface. However, the plasma process has an adverse effect on the gate structures of FET devices. Plasma damage to the gate structures will cause an undesirable shift in threshold voltages of the gate structures, reducing the reliability of the FET devices.

As described above, there is a need to provide gate capping layers having improved adhesion at the interfaces with their underlying ILD layers and methods of forming the same.

SUMMARY

To achieve the foregoing and other aspects of the present disclosure, gate capping layers of semiconductor devices having improved adhesion at the interfaces with the underlying dielectric layers and methods of forming the same are presented.

According to an aspect of the present disclosure, a semiconductor device is provided, which includes providing an active region, a source region, a drain region, a dielectric layer, a gate structure and a nitrogen-infused dielectric layer. The source and the drain regions are formed in the active region. The dielectric layer is disposed over the source region and the drain region. The gate structure is disposed in the dielectric layer and positioned between the source and the drain regions. The nitrogen-infused dielectric layer is disposed over the dielectric layer and over the gate structure.

According to another aspect of the present disclosure, a semiconductor device is provided, which includes providing an active region, a source region, a drain region, a dielectric layer, a gate structure and a second dielectric layer. The source and the drain regions are formed in the active region and the first dielectric layer is disposed over the source and the drain regions. The gate structure is disposed in the first dielectric layer and positioned between the source and the drain regions. The second dielectric layer, having a gradient nitrogen concentration therein, is formed over the first dielectric layer and over the gate structure.

According to yet another aspect of the present disclosure, a method of forming a semiconductor device is provided, which includes providing a gate structure over an active region and forming a source region and a drain region in the active region. The source and the drain regions are positioned on opposite sides of the gate structure. A first dielectric layer is deposited over the source and the drain regions and leveled to be substantially coplanar with the gate structure. A second dielectric layer is deposited over the first dielectric layer and over the gate structure. A nitridation process is performed on the second dielectric layer to form a nitrogen-infused dielectric layer.

BRIEF DESCRIPTION OF THE DRAWINGS

The embodiments of the present disclosure will be better understood from a reading of the following detailed description, taken in conjunction with the accompanying drawings.

Figure 1A:
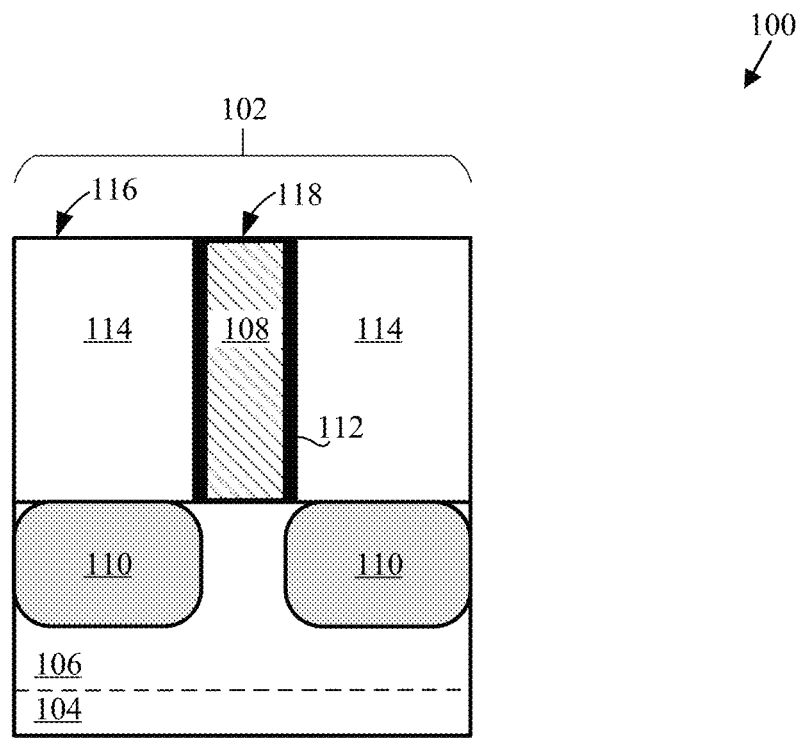
FIGS. 1A-1D are cross-sectional views of a partially processed semiconductor device, illustrating a method of forming a gate capping layer for the semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The present disclosure relates to gate capping layers of semiconductor devices having improved adhesion at interfaces with underlying dielectric layers and methods of forming the same. The semiconductor device may include complementary metal-oxide-semiconductor (CMOS) devices such as P-type metal-oxide-semiconductor (PMOS) devices and/or N-type metal-oxide-semiconductor (NMOS) devices. It is understood that the following disclosure is not limited to any particular type of semiconductor devices. The method disclosed herein may be applied to any type of semiconductor devices, such as tri-gate field effect transistor (FET) devices, fin-type FET (FinFET) devices or planar-type metal-oxide-semiconductor FET (MOSFET) devices.

The semiconductor device may be fabricated with a gate-first, a gate-last or a hybrid fabrication process. In a gate-first process, conductive layers are formed over active regions and patterned to form gate structures. This is followed by conventional CMOS processing, including formation of source and drain regions, formation of gate spacers and deposition of inter-level dielectric (ILD) material. In a gate-last process, dummy gate structures are formed followed by conventional CMOS processing including formation of the source and drain regions, formation of gate spacers and deposition of ILD material. Thereafter, the dummy gate structures are removed followed by conventional formation of replacement gate structures. In the hybrid fabrication process, a gate structure of one type of device may be formed first and a gate structure of another type of device may be formed last.

Aspects of the disclosure are now described in detail with accompanying drawings. It is noted that like and corresponding elements are referred to by the use of the same reference numerals. However, it is noted that specific elements may be denoted by a reference numeral and a suffix, for example 120NU, 120NL, etc. When those elements are referred to generically, merely the reference numerals are used, for example 120, 220, etc.

FIGS. 1A-1D are cross-sectional views of a partially processed semiconductor device 100, illustrating a method of forming a gate capping layer of a semiconductor device, according to embodiments of the disclosure.

FIG. 1A is a cross-sectional view of the semiconductor device 100, including at least one device region 102. The device region 102 is used for forming a field effect transistor (FET) device, such as a PMOS device or an NMOS device. The device region 102 further includes a semiconductor substrate 104, an active region 106, a gate structure 108 and a pair of source and drain regions 110. The active region 106 is formed above the substrate 104 (a dashed line has been arbitrarily demarcated to show an intersection between the substrate 104 and the active region 106).

The semiconductor substrate 104 may include of any suitable semiconductor material, such as silicon, silicon germanium, silicon carbon, other II-VI or III-V semiconductor compounds and the like. In one embodiment of the disclosure, the semiconductor material of the substrate 104 is preferably silicon. The active region 106 may include fins in FinFET devices or other active regions such as a doped layer on a top surface of a bulk semiconductor substrate or a semiconductor-on-insulator (SOI) layer.

The gate structure 108 is formed over the active region 106. The gate structure 108 may be formed by a gate-first or a gate-last fabrication process. Although not shown in the accompanying drawings, the gate structure 108 may include one or more insulating layers (e.g., silicon dioxide, hafnium oxide, or a layer of high-k dielectric material having a dielectric constant of typically 10 or greater, etc.) and/or conductive layers (e.g., seed layers, work function layers or fill layers, etc.) that will be part of the gate electrode of the gate structure 108. Sidewalls of the gate structure 108 are disposed with gate spacers 112. The gate spacers 112 may be formed of a low-k dielectric material, i.e., a dielectric material having a low dielectric constant, to at least contribute to electrically isolate the gate structure 108 from adjacent conductive structures. The gate spacers 112 may include silicon nitride, silicon oxide or other suitable low-k dielectric materials having any suitable thicknesses.

The gate structure 108 is further isolated from adjacent conductive structures by an ILD layer 114. The ILD layer 114 is deposited using a conventional deposition process, such as plasma-enhanced CVD (PECVD) process. The ILD layer 114 has a top surface 116 substantially coplanar with a top surface 118 of the gate structure 108. In one embodiment of the disclosure, the ILD layer 114 is an oxide layer. In another embodiment of the disclosure, the ILD layer 114 is preferably a silicon dioxide layer.

The pair of source and drain regions 110 are formed in the active region 106 and positioned on opposite sides of the gate structure 108. In one embodiment of the disclosure, where an NMOS device is desired, the pair of source and drain regions 110 may include epitaxially-grown silicon. In another embodiment of the disclosure, where a PMOS device is desired, the pair of source and drain regions 11 may include epitaxially-grown silicon germanium. Other suitable materials to form the pair of source and drain regions 110 have been contemplated, such as silicon phosphorous, silicon phosphorous carbide, germanium, gallium arsenide, gallium nitride, aluminum gallium indium phosphide, and/or other suitable combinations.

Figure 1B:
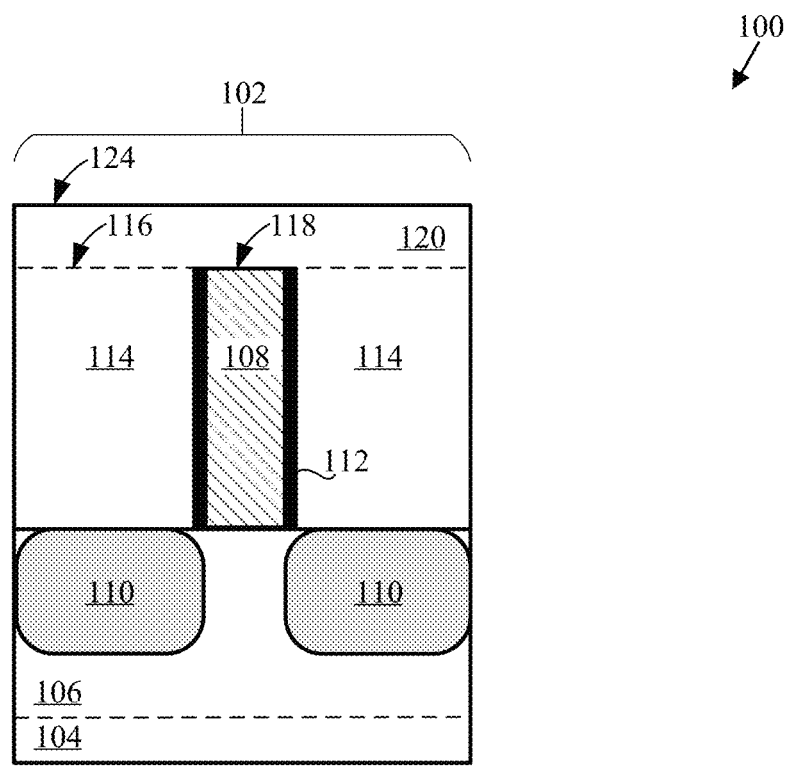

FIG. 1B is a cross-sectional view of the semiconductor device 100 after depositing a dielectric layer 120, according to an embodiment of the disclosure. The dielectric layer 120 is deposited over the gate structure 108 and the ILD layer 114, the dielectric layer 120 having a top surface 124. An interface is formed between the dielectric layer 120 and the ILD layer 114 and the interface is demarcated by a dashed line. The dielectric layer 120 is preferably formed of a similar oxide material as the ILD layer 114, e.g., silicon dioxide, silicon oxycarbide, silicon oxycarbonitride, or other suitable oxide layers. Due to the similarity in material properties, the oxide-oxide interface between the dielectric layer 120 and the ILD layer 114 forms a strong adhesion at the interface. In this embodiment of the disclosure, the dielectric layer 120 forms a gate capping layer for the semiconductor device 100.

The dielectric layer 120 is preferably deposited using a thermal chemical vapor deposition (CVD) process, such as a sub-atmospheric pressure CVD (SACVD) process, a rapid thermal CVD (RTCVD) process, a spin-on coating process or other suitable deposition processes that do not include the use of plasma. In one embodiment of the disclosure, the dielectric layer 120 has a thickness ranging from about 5 nm to about 25 nm. In another embodiment of the disclosure, the dielectric layer 120 is preferably deposited in a suitable processing chamber having a chamber temperature ranging from ambient temperature to about 400° C.

Figure 1C:
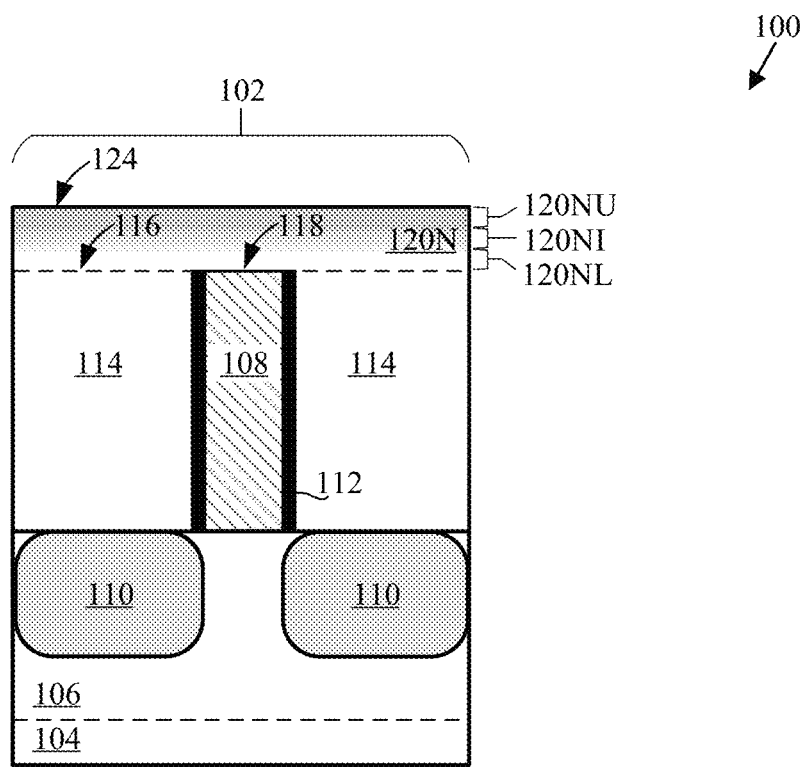

FIG. 1C is a cross-sectional view of the semiconductor device 100 after subjecting the dielectric layer 120 to a nitridation process, according to an embodiment of the disclosure. The nitridation process typically includes modifying a first material, i.e., the dielectric layer 120, such that nitrogen atoms or compounds are incorporated into the first material.

In this embodiment of the disclosure, ultraviolet (UV)-generated active species are employed in the nitridation process. As used herein, the term "UV-generated active species" are UV-generated radicals and/or ionized species that are in an excited state caused by UV radiation. The UV-generated active species may be formed by exposing any suitable precursor to UV radiation; the precursor being capable of generating the desired active species for the desired process. The UV-generated active species may be generated in-situ or remotely by UV radiation powered by radio frequency (RF) energy sources, microwave power sources, or other suitable power sources. Sources of UV radiation include, but not limited to, UV lamps or UV light emitting diodes. The UV-generated active species may be introduced into any suitable processing chamber at a process stage in which the dielectric layer 120 can be treated with the active species.

The nitridation process is typically performed in an environment rich in nitrogen, providing nitrogen-containing precursors in order to incorporate nitrogen into the dielectric layer 120. Nitrogen-containing precursors include nitrogen gas, nitrous oxide gas, nitrogen monoxide gas, ammonia gas, or any suitable nitrogen-containing gas that is suitable for nitridating the dielectric layer 120.

The top surface 124 of the dielectric layer 120 is exposed in the nitrogen-rich environment such that the UV-generated nitrogen active species infuse into the dielectric layer 120, i.e., the UV-generated nitrogen active species displace oxygen atoms in the dielectric layer 120, to form a nitrogen-infused dielectric layer 120N. The dielectric layer 120 is modified such that the nitrogen concentration is at a relatively high concentration proximal to the top surface 124 of the nitrogen-infused dielectric layer 120N. The nitrogen concentration has a decreasing gradient depth-wise from an upper portion to a lower portion of the nitrogen-infused dielectric layer 120N. The gradient of the nitrogen concentration may be a linear gradient, an exponential gradient or having other profiles of nitrogen concentration depth-wise through the nitrogen-infused dielectric layer 120N, and may vary to specific needs of the semiconductor devices. The nitridation process is preferably performed in a low temperature processing chamber having a chamber temperature ranging from ambient temperature to about 400° C.

In this embodiment of the disclosure, it is preferable to form the nitrogen-infused dielectric layer 120N having the highest nitrogen concentration proximal to the top surface 124 of the nitrogen-infused dielectric layer 120N. An upper portion 120NU of the nitrogen-infused dielectric layer 120N may form a predominantly silicon nitride rich layer, while a lower portion 120NL of the nitrogen-infused dielectric layer 120N remains predominantly an oxide rich layer. An intermediate portion 120NI of the nitrogen-infused dielectric layer 120N may be formed of an intermix concentration of nitrogen and oxygen. In one embodiment of the disclosure, the upper portion 120NU of the nitrogen-infused dielectric layer 120N has a thickness ranging from about 1.5 nm to about 10 nm. As used herein, the term "nitrogen-infused" refers to an introduction of nitrogen atoms or compounds by means of diffusion, deposition, implantation, etc.

Generally, if dielectric layer 120 is exposed to the UV-generated nitrogen active species for a sufficient period of time, nitrogen atoms may be incorporated throughout an entire thickness of the dielectric layer 120 to form the nitrogen-infused dielectric layer 120N having a generally uniform nitrogen concentration. The profile of nitrogen concentration in the nitrogen-infused dielectric layer 120N may be controlled during the nitridation process. Some typical process parameters to control the nitridation process include process duration, UV power output and/or gas flow rate of UV-generated active species.

It is advantageous and preferable to form a predominantly silicon nitride rich layer at the upper portion 120NU of the nitrogen-infused dielectric layer 120N. The presence of a high concentration of the nitrogen atoms at the upper portion 120NU of the nitrogen-infused dielectric layer 120N is capable of blocking, or at least diminishing, potential plasma damage to the underlying gate structure 108. ILD layers are conventionally deposited using a plasma-enhanced CVD (PECVD) process. The associated use of plasma to deposit overlying ILD layers may cause plasma damage to the underlying gate structure, thereby altering the threshold voltage of the gate structure and undesirably lowering the reliability of the semiconductor device 100. The lower portion 120NL of the nitrogen-infused dielectric layer 120N, i.e., a predominantly oxide rich layer, maintains the strong oxide-oxide adhesion at the interface to prevent potential diffusion of conductive material from the gate structure 108 to adjacent conductive structures.

Figure 1D:
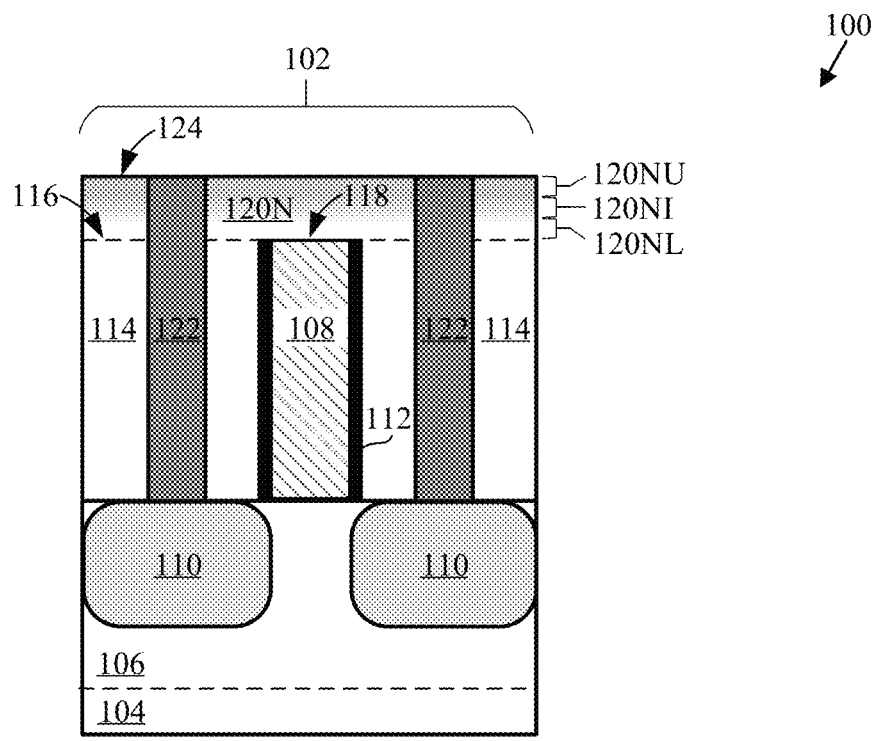

FIG. 1D is a cross-sectional view of the semiconductor device 100 after forming contact structures 122, according to an embodiment of the disclosure. The contact structures 122 are formed through the nitrogen-infused dielectric layer 120N to the source and drain regions 110 to establish an electrical connection between the source and drain regions 110 to other regions of the semiconductor device 100, e.g., back-end-of-line (BEOL) region of the semiconductor device 100. The BEOL region typically includes a plurality of conductive lines and interconnect vias that are routed as needed across the semiconductor device 100.

Figure 2:
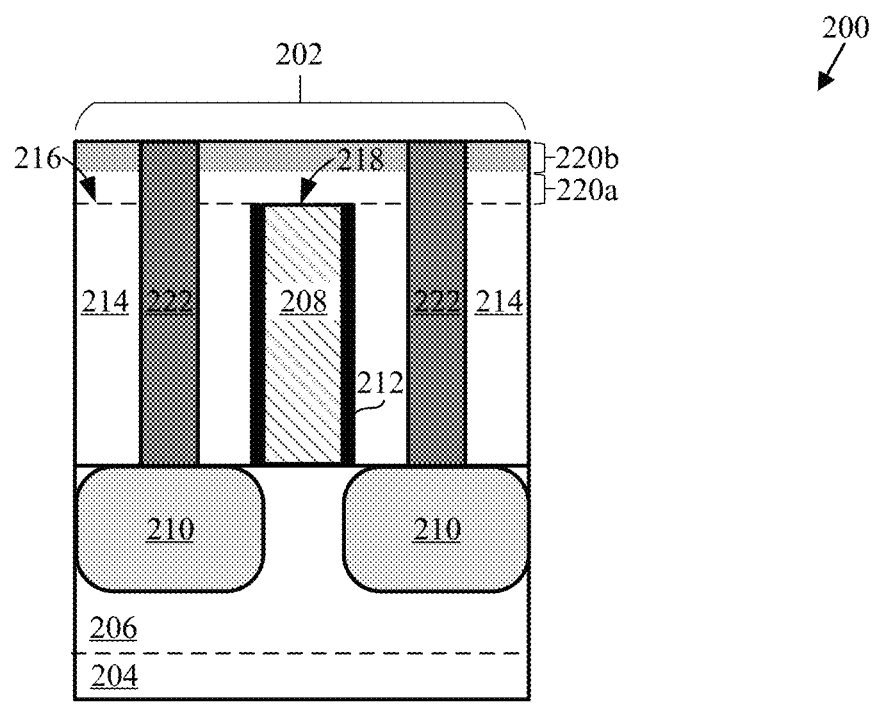
FIG. 2 is a cross-sectional view of a semiconductor device, according to an embodiment of the disclosure.

FIG. 2 is a cross-sectional view of the semiconductor device 200, according to an alternative embodiment of the disclosure. The semiconductor device 200 includes at least one device region 202. The device region 202 is used for forming a desired field effect transistor (FET) device, such as a PMOS device or an NMOS device. The device region 202 further includes a semiconductor substrate 204, an active region 206, a gate structure 208 and a pair of source and drain regions 210. The active region 206 is formed above from the substrate 204 (a dashed line has been arbitrarily demarcated to show the intersection between the substrate 204 and the active region 206).

The gate structure 208 is formed over the active region 206. Sidewalls of the gate structure 208 are disposed with gate spacers 212 to at least contribute to electrically isolate the gate structure 208 from adjacent conductive structures. The gate structure 208 is further isolated from adjacent conductive structures by an ILD layer 214. The ILD layer 214 has a top surface 216 substantially coplanar with a top surface 218 of the gate structure 208. The gate structure 208 is positioned between the pair of source and drain regions 210 formed in the active region 206. The source and drain regions 210 may be fabricated according to the desired FET device, i.e., NMOS device or PMOS device, intended for the device region 202.

The semiconductor device 200 includes a multi-layer gate capping structure 220. A first portion 220a of the gate capping structure 220 is deposited over the gate structure 208 and the ILD layer 214 preferably using a suitable thermal CVD process. The first portion 220a of the gate capping structure 220 is preferably a predominantly oxide layer having little or absence of nitrogen concentration to form a strong oxide-oxide adhesion at the interface with the ILD layer 214. The first portion 220a of the gate capping structure 220 may include silicon dioxide, silicon oxycarbide, silicon oxycarbonitride, or other suitable oxide layers. A second portion 220b of the gate capping structure 220 is deposited over the first portion 220a using a suitable thermal CVD process. The second portion 220b of the gate capping structure 220 is preferably a predominantly nitrogen-infused layer having a high nitrogen concentration, such as a silicon nitride layer. An intermediate portion (not shown) of the gate capping structure 220 may form an intermix concentration of nitrogen and oxygen within the gate capping structure 220, using a suitable annealing process such as rapid thermal annealing (RTA), laser annealing or the like.

In one embodiment of the disclosure, the gate capping structure 220 has a thickness ranging from about 5 nm to about 25 nm. In another embodiment of the disclosure, the second portion 220b of the gate capping structure 220 has a thickness ranging from about 0.5 nm to about 10 nm.

Figure 3:
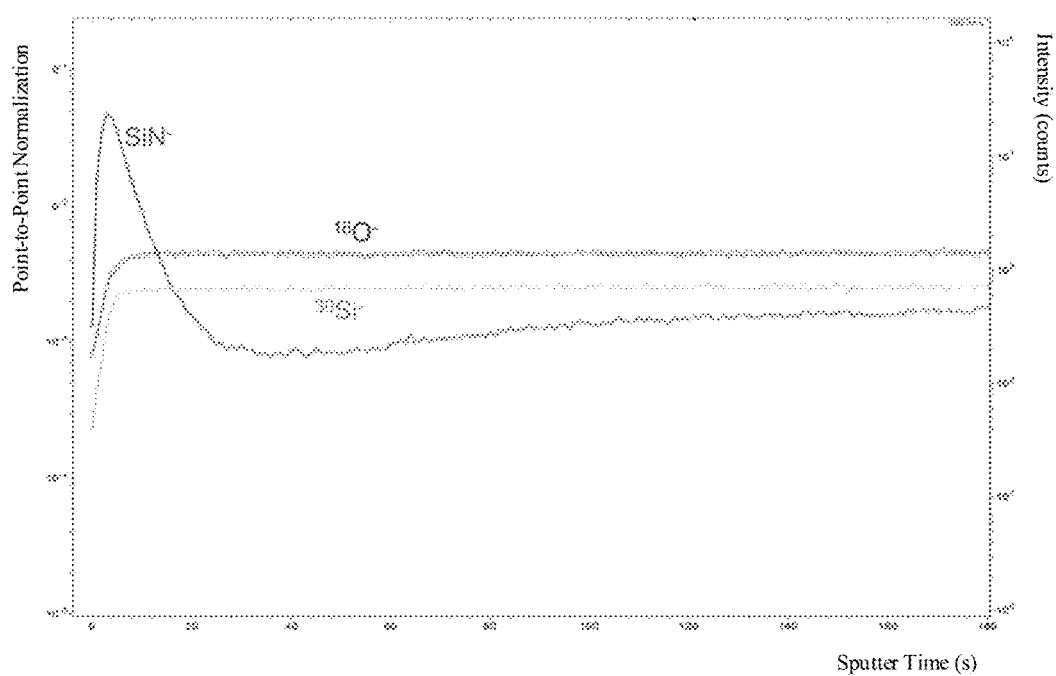
FIG. 3 illustrates a depth profile analysis of a modified gate capping layer using time-of-flight secondary ion mass spectrometry (TOF-SIMS), according to an embodiment of the disclosure.

FIG. 3 illustrates a depth profile analysis of a modified gate capping layer, as exemplarily illustrated in FIG. 1, using time-of-flight secondary ion mass spectrometry (TOF-SIMS), according to an embodiment of the disclosure. TOF-SIMS is a surface characterization technique which is based upon the liberation and identification of ions that are sputtered from a sample's surface and has the capability to selectively etch away material and perform in-depth analysis. The data provides molecular and elemental information about the sample.

In this TOF-SIM analysis, the gate capping layer is a silicon oxide layer deposited using an SACVD process. The gate capping layer was subjected to a nitridation process at a temperature of about 250° C. to form a modified gate capping layer having a silicon nitride layer at an upper portion of the gate capping layer. The silicon nitride layer has a thickness ranging from about 0.5 nm to 1 nm. The TOF-SIMS analysis was performed for time-of-flight, or sputter time, ranging from 0 s to 180 s. Three isotopes are easily identified in the modified gate capping layer, namely silicon nitride, oxygen and silicon. A silicon nitride peak was observed proximal to a top surface of the modified gate capping layer, indicating a high concentration of nitrogen. A decreasing gradient of nitrogen concentration was observed as sputter time increases, providing the molecular and elemental information deeper into the modified gate capping layer. The profile of the silicon nitride peak may be controlled during the nitridation process by shortening or extending the duration of the nitridation process on the modified gate capping layer.

In the above detailed description, a method of forming a gate capping layer for a semiconductor device is presented. A gate structure formed within an ILD layer is provided. A dielectric layer having a top surface is deposited over the gate structure and the ILD layer. The dielectric layer is preferably an oxide layer. Due to material compatibility between the ILD layer and the dielectric layer, a strong oxide-oxide adhesion at the interface can be formed between the ILD layer and the dielectric layer. The top surface dielectric layer is subjected to a nitridation process using UV-generated active species. The nitridation process provides nitrogen-containing precursors to incorporate nitrogen into the dielectric layer.

By exposing the dielectric layer to the nitrogen-containing precursors, the UV-generated nitrogen active species diffuse into the dielectric layer. The nitrogen atoms displace oxygen atoms in the dielectric layer to form a nitrogen-infused dielectric layer having a decreasing gradient of nitrogen concentration depth-wise from an upper portion to a lower portion of the nitrogen-infused dielectric layer. An upper portion of the nitrogen-infused dielectric layer has the highest nitrogen concentration and forms a predominantly silicon nitride rich layer, while a lower portion of the nitrogen-infused dielectric layer remains predominantly an oxide rich layer.

The dielectric layer may also be a multi-layer dielectric layer, formed by depositing an oxide layer over the gate structure and the ILD layer, followed by depositing a nitride layer over the oxide layer using suitable thermal CVD deposition processes.

Having the upper portion of the nitrogen-infused dielectric layer being predominantly silicon nitride advantageously blocks potential plasma damage to the underlying gate structures resulting from deposition of overlying ILD layers, while maintaining a strong oxide-oxide adhesion at the interface between the lower portion of the nitrogen-infused dielectric layer and the underlying ILD layer.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   an active region;
   a source region and a drain region in the active region;
   a dielectric layer over the source region and the drain region;
   a gate structure in the dielectric layer positioned between the source region and the drain region; and
   a nitrogen-infused dielectric layer directly contacting the dielectric layer and a top surface of the gate structure, wherein an upper portion of the nitrogen-infused dielectric layer is a predominantly nitride-rich layer and a lower portion of the nitrogen-infused dielectric layer is a predominantly oxide-rich layer.

2. The semiconductor device of claim 1, wherein the nitrogen-infused dielectric layer comprises a gradient concentration of nitrogen and oxygen.

3. The semiconductor device of claim 2, wherein the gradient concentration of nitrogen and oxygen further comprises a decreasing gradient of nitrogen concentration depthwise from the upper portion to the lower portion of the nitrogen-infused dielectric layer.

4. The semiconductor device of claim 1, wherein the nitrogen-infused dielectric layer has a thickness ranging from 5 nm to 25 nm.

5. The semiconductor device of claim 1, wherein the predominantly nitride-rich upper portion of the nitrogen-infused dielectric layer comprises predominantly of silicon nitride.

6. The semiconductor device of claim 1, wherein the dielectric layer is an interlayer dielectric (ILD) layer.

7. The semiconductor device of claim 1, wherein the predominantly oxide-rich lower portion of the nitrogen-infused dielectric layer comprises predominantly of silicon dioxide, silicon oxycarbide or silicon oxycarbonitride.

8. A semiconductor device comprising:
an active region;
a source region and a drain region in the active region;
a first dielectric layer over the source region and the drain region;
a gate structure in the first dielectric layer positioned between the source region and the drain region; and
a second dielectric layer having a gradient concentration of nitrogen therein, directly contacting the first dielectric layer and a top surface of the gate structure.

9. The semiconductor device of claim 8, wherein the gradient concentration of nitrogen includes a decreasing concentration of nitrogen from an upper portion to a lower portion of the second dielectric layer.

10. The semiconductor device of claim 8, wherein a lower portion of the second dielectric layer further comprises predominantly of silicon dioxide, silicon oxycarbide or silicon oxycarbonitride.

11. The semiconductor device of claim 8, wherein an upper portion of the second dielectric layer further comprises predominantly of silicon nitride.

12. The semiconductor device of claim 11, wherein the silicon nitride has a thickness ranging from 0.5 nm to 10 nm.

13. The semiconductor device of claim 8 wherein the second dielectric layer has a thickness ranging from 0.5 nm to 25 nm.

14. A method of forming a semiconductor device comprising:
providing a gate structure over an active region;
forming a source region and a drain region in the active region, wherein the source region and the drain region are positioned on opposite sides of the gate structure;
depositing a first dielectric layer over the source region and the drain region;
leveling the first dielectric layer to be substantially coplanar with the gate structure;
depositing a second dielectric layer directly contacting the first dielectric layer and a top surface of the gate structure; and
performing a nitridation process on the second dielectric layer to form a nitrogen-infused dielectric layer.

15. The method of claim 14, wherein the second dielectric layer is deposited using a thermal chemical vapor deposition process.

16. The method of claim 14, wherein the nitridation process is performed at a temperature ranging from ambient temperature to 400° C.

17. The method of claim 14, wherein the nitridation process forms a decreasing gradient of nitrogen concentration depthwise through the nitrogen-infused dielectric layer with a highest nitrogen concentration proximal to a top surface of the nitrogen-infused dielectric layer.

18. The method of claim 17, wherein the nitridation process forms a predominantly silicon nitride layer at an upper portion of the nitrogen-infused dielectric layer.

19. The method of claim 14, wherein the nitridation process comprises forming UV-generated nitrogen active species and exposing the second dielectric layer to the UV-generated nitrogen active species.

20. The method of claim 19, wherein the UV-generated nitrogen active species are formed from nitrogen-containing precursors including nitrogen gas, nitrous oxide gas, nitrogen monoxide gas or ammonia gas.

* * * * *